United States Patent
Samavedam et al.

(10) Patent No.: US 6,894,353 B2
(45) Date of Patent: May 17, 2005

(54) CAPPED DUAL METAL GATE TRANSISTORS FOR CMOS PROCESS AND METHOD FOR MAKING THE SAME

(75) Inventors: Srikanth B. Samavedam, Austin, TX (US); Philip J. Tobin, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 53 days.

(21) Appl. No.: 10/209,523

(22) Filed: Jul. 31, 2002

(65) Prior Publication Data

US 2004/0023478 A1 Feb. 5, 2004

(51) Int. Cl.[7] .............................................. H01L 29/76
(52) U.S. Cl. ........................ 257/365; 257/412; 438/275; 438/283
(58) Field of Search ................................ 257/365, 368, 257/369, 412; 438/197, 199, 275, 283

(56) References Cited

U.S. PATENT DOCUMENTS

| | | | |
|---|---|---|---|
| 4,593,454 A | * | 6/1986 | Baudrant et al. ........... 438/586 |
| 4,605,947 A | | 8/1986 | Price et al. |
| 5,960,270 A | * | 9/1999 | Misra et al. ................ 438/197 |
| 6,033,963 A | * | 3/2000 | Huang et al. ............... 438/303 |
| 6,049,114 A | | 4/2000 | Maiti et al. |
| 6,084,279 A | | 7/2000 | Nguyen et al. |
| 6,190,981 B1 | | 2/2001 | Lin et al. |
| 6,346,734 B2 | | 2/2002 | Divakaruni et al. |
| 6,444,512 B1 | * | 9/2002 | Madhukar et al. .......... 438/203 |
| 6,518,106 B2 | * | 2/2003 | Ngai et al. .................. 438/157 |
| 6,545,324 B2 | * | 4/2003 | Madhukar et al. .......... 257/371 |
| 6,562,676 B1 | * | 5/2003 | Ju .............................. 438/232 |
| 6,563,178 B2 | * | 5/2003 | Moriwaki et al. .......... 257/369 |
| 6,607,950 B2 | * | 8/2003 | Henson et al. .............. 438/197 |
| 6,794,281 B2 | | 9/2004 | Madhukar et al. |

FOREIGN PATENT DOCUMENTS

JP     60/045053     3/1985

OTHER PUBLICATIONS

Halas et al., Work functions of elements expressed in terms of the Fermi energy and the density of free electrons, *J. Phys.: Condes. Matter*, 10 (Dec. 1998) 10815.*

Cheng et al., Metal gates for advanced sub–80–nm SOI CMOS technology, *2001 IEEE Inter. SOI Conf.*, (Oct. 2001) 91.*

Lu et al.; "Dual–Metal Gate Technology For Deep Submicron CMOS Transistors;" IEEE, Symposium on VLSI Technology Digest of Technical Paper; pp. 72–73 (2000).

Maiti et al., "Metal Gates for Advanced CMOS Technology," SPIE Conference on Microelectronic Device Technology III, SPIE vol. 3881, pp. 46–57 (1999).

\* cited by examiner

*Primary Examiner*—Christian Wilson
(74) *Attorney, Agent, or Firm*—Patricia S. Goddard; Kim Marie Vo

(57) ABSTRACT

A first gate (120) and a second gate (122) are preferably PMOS and NMOS transistors, respectively, formed in an n-type well (104) and a p-type well (106). In a preferred embodiment first gate (120) includes a first metal layer (110) of titanium nitride on a gate dielectric (108), a second metal layer (114) of tantalum silicon nitride and a silicon containing layer (116) of polysilicon. Second gate (122) includes second metal layer (114) of a tantalum silicon nitride layer on the gate dielectric (108) and a silicon containing layer (116) of polysilicon. First spacers (124) are formed adjacent the sidewalls of the gates to protect the metals from chemistries used to remove photoresist masks during implant steps. Since the chemistries used are selective to polysilicon, the spacers (124) need not protect the polysilicon capping layers, thereby increasing the process margin of the spacer etch process. The polysilicon cap also facilitates silicidation of the gates.

9 Claims, 3 Drawing Sheets

CAPPED DUAL METAL GATE TRANSISTORS FOR CMOS PROCESS AND METHOD FOR MAKING THE SAME

CROSS-REFERENCE TO RELATED APPLICATION

The present application is related to a commonly assigned, co-pending application by Madhukar et al. entitled, "Dual Metal Gate Transistors for CMOS Process," filed Jun. 12, 2000 as U.S. Ser. No. 09/592,448; and to a commonly assigned, co-pending application by Ngai et al. entitled, "Semiconductor Device and a Method Therefor," filed May 26, 2001 as U.S. Ser. No. 09/865,855.

FIELD OF THE INVENTION

The present invention is related to the field of semiconductor fabrication and more particularly to a fabrication process incorporating differing gate metals for NMOS (n-channel metal oxide semiconductor) and PMOS (p-channel MOS) devices.

RELATED ART

In the field of semiconductor fabrication, it is typically desirable to fabricate n-channel and p-channel transistors with matching threshold voltages. In addition, it is desirable if the absolute value of the n-channel and p-channel threshold voltages are close to zero to increase the device speed. In conventional semiconductor processing, n-channel and p-channel threshold voltages are conventionally adjusted by a combination of channel implants and selective doping of a polysilicon gate. The use of polysilicon gate structures is becoming unfeasible as gate dielectric thicknesses steadily decrease. More specifically, boron diffusion from p-type polysilicon gates into the transistor channel and poly depletion effects associated with devices having low thermal budget and thin gate oxides are making it increasingly difficult to incorporate polysilicon gates into advanced technologies. In addition, as semiconductor processing moves away from the use of silicon dioxide as a gate dielectric, chemical reactions between polysilicon and alternative gate dielectric structures render polysilicon less desirable as a gate of choice.

One approach to overcome some of the aforementioned problems is to use a metal gate, for example a titanium nitride (TiN) gate which may be capped with a lower resistance metal such as tungsten (W). An extension of this approach is to use a dual metal gate process, wherein a first metal is used to form the gates for PMOS devices while a second different metal is used to form the gates for NMOS devices. The reason for differing metals is so that the work functions can be optimized for each type of device. For PMOS devices, an ideal work function is approximately 5.1 eV, whereas an ideal work function for NMOS devices is approximately 4.0 eV. (See, e.g., "Metal Gates for Advanced Sub-80 nm SOI CMOS Technology," B. Cheng et al. 2001 IEEE International SOI Symposium Proceedings, pp. 91–92, 2001.)

One problem with the use of metal gates is that most metals are etched when exposed to conventional "pirhana" cleans and SC-1 (Standard Clean-1) cleans. A pirhana clean consists of sulfuric acid, hydrogen peroxide, and water. An SC-1 clean consists of ammonium hydroxide, hydrogen peroxide, and water. These cleans are used throughout the industry to remove photoresist masks used to mask the substrates during various etch, implant and other fabrication steps. More specifically, the problem lies in removing photoresist masks following extension and halo implants for devices having metal gates. These implants are typically performed just after the gates are patterned and etched. In removing the photoresist implant masks, the piranha or SC-1 solutions attack the metal gates as well.

Therefore, it would be highly desirable to have a fabrication process in which dual metal gates can be formed which are resistant to standard etch and clean chemistries to which the gates may be exposed. Furthermore, it would be desirable if the implemented process was compatible with a variety of gate materials, and was easily used in conjunction with a silicide process.

BRIEF DESCRIPTION OF THE DRAWINGS

The present invention is illustrated by way of example and not limitation in the accompanying figures, in which like references indicate similar elements, and in which.

Figure 1:
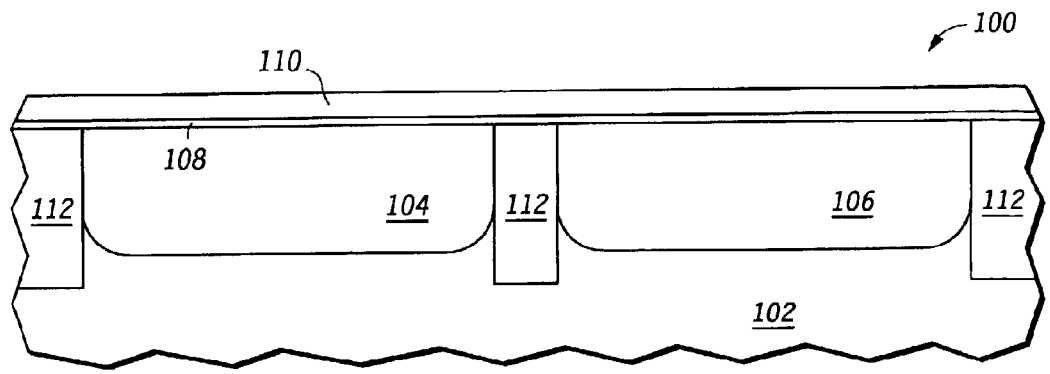
FIG. 1 is a partial cross sectional view of a partially completed semiconductor device according to one embodiment of the invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally, the present invention overcomes the previously described problem of etchant attacks on dual metal gate structures through a combination of spacers and a polysilicon capping layer. Thin, "zero spacers", preferably of silicon nitride, are formed immediately adjacent the patterned gate structures in each of the PMOS and NMOS portions of the device. The extension implants, and halo implants if used, are then performed. The zero spacers protect the sides of the gate structure during removal of the photoresist mask used to mask the implants. A polysilicon capping layer is used to protect the top of the gate structures. Polysilicon is not attacked by conventional pirhana or SC-1 cleans.

The polysilicon capping layer was also found to be beneficial in protecting the sides of the gate structure. A problem discovered by Applicants in using zero layer spacers alone, or zero layer spacers in conjunction with an overlying ARC (anti-reflective coating) on the gates, is that topographical variations across the wafer surface made it very difficult to control the zero layer spacer etch. The zero layer spacer etch is more or less a timed etch because the etch is not sufficiently selective to the underlying gate dielectric material. With topographical variations across the wafer (e.g. active regions versus isolation regions), a great deal of variation in the spacer protection of the gate structures was observed. For example, while the spacers sufficiently protected sidewalls of the gates in the active region, where these gate metals crossed over isolation regions the metal sidewalls may be exposed and attacked during removal of photoresist masks. By employing a polysilicon cap on top of the gate structure there is much greater tolerance (process margin) for the variability of zero layer spacers.

Further benefits of using the polysilicon capping layer include the ability to contact the gate electrode without a separate etch step previously needed to open or etch the ARC formed on the gate. With the present invention, the ARC layer can be removed immediately after patterning the gates because it is not needed as a protecting layer during etches (the polysilicon cap serves this function). Furthermore, the polysilicon cap readily enables silicidation of the gates with the source/drain regions of the device in a self-aligned manner.

These benefits and advantages will be more readily understood upon reading of the following detailed description when taken in conjunction with the respective illustrations. It is noted that the illustrations are not drawn to scale in all respects but accuracy in scale is not necessary for understanding the invention. Furthermore, there are likely to be other embodiments within the scope of the invention that are not specifically illustrated.

FIGS. 1–7 illustrate cross sectional views at various stages of one embodiment of a semiconductor process according to the present invention. In FIG. 1, a partially completed semiconductor device 100 is illustrated. Semiconductor device 100 as depicted in FIG. 1 includes a semiconductor substrate 102 into which a first well 104 and a second well 106 have been formed. Typically, semiconductor substrate 102 includes a lightly doped n-type or p-type single crystal silicon, but other semiconductor materials may be used. The depicted embodiment of semiconductor device 100 is fabricated with a twin well process in which first well 104 is selectively implanted into portions of substrate 102 where devices of a first conductivity type will be formed while second well 106 is selectively implanted into regions of substrate 102 into which transistors of a second different and opposite conductivity type will be formed. In one embodiment of the twin well process, the first well 104 may itself be enclosed within a tub (not depicted) in which the conductivity type of first well 104 and the tub are opposite. In another embodiment, substrate 102 may include a lightly doped epitaxial layer formed over a heavily doped bulk. In one embodiment, for example, the depicted portion of substrate 102 is a p-epitaxial layer formed over a p+ bulk, while first well 104 is doped n-type while second well 106 is p-type. N-type conductivity structures may be formed by implanting semiconductor substrate 102 with a suitable n-type impurity such as phosphorus or arsenic while p-type structures may be formed by implanting with a suitable p-type impurity such as boron. First well 104 and second well 106, as depicted in FIG. 1, are isolated from one another with trench isolation structures 112. Trench isolation structures 112 may comprise a suitable insulator such as a dielectric material. Trench isolation structures 112 may include an oxide, nitride, or other suitable electrical insulator material. In a preferred embodiment, trench isolation structures 112 comprise silicon dioxide.

A gate dielectric 108 is formed over first and second wells 104 and 106 of substrate 102. In one embodiment, gate dielectric 108 comprises a conventional, thermally formed silicon dioxide or silicon oxynitride with a thickness of preferably less than 10 nanometers. In another embodiment, gate dielectric 108 may comprise an alternative gate material such as a first or second transition metal oxide or rare earth oxide material. Such alternative gate dielectric materials are suitable for their high dielectric constant (K), which enables the use of a thicker gate dielectric layer without adversely affecting the electrical and capacitive characteristics of the film. One preferred high K gate dielectric is hafnium oxide ($HfO_2$). For these alternative gate dielectrics, suitable transition metal oxide composites selected from oxides of zirconium, hafnium, aluminum, lanthanum, strontium, tantalum, titanium, silicon and the combinations thereof may be used. Transition metal silicates and aluminates may also be used for the gate dielectric, such as hafnium silicate ($Hf_xSi_yO_z$) hafnium aluminate ($Hf_xAl_yO_z$).

As further depicted in FIG. 1, a first metal 110 of a first metal type is deposited over gate dielectric 108. As described in greater detail below, first metal 110 will be selectively removed from portions of semiconductor substrate 102 in which transistors of one conductivity type are fabricated such that first metal 110 will exist only where transistors of the other conductivity type are located. Preferably, first metal 110 is deposited with a chemical vapor deposition (CVD) process to protect the integrity of gate dielectric 108. In an alternative embodiment, first metal 110 may be physical vapor deposited with a sputter process. In embodiments in which first metal 110 will ultimately remain on p-type transistors (i.e. when a PMOS device is to be formed in the left-half of device 100 as illustrated in FIG. 1), it is desirable if the first metal type has a work function that is close to the valence band of silicon (i.e. a work function of approximately 5.1 eV) when substrate 102 is silicon. In this embodiment, suitable metals for first metal 110 include titanium nitride (TiN), rhenium (Re), iridium (Ir), platinum (Pt), and ruthenium oxide ($RuO_2$), iridium oxide ($IrO_2$), molybdenum nitride (MoN), ruthenium (Rh), and indium oxide ($InO_2$). In a preferred embodiment, first metal layer if used in a PMOS device is TiN deposited by chemical vapor deposition (CVD), because sputtered TiN has a lower work function and is therefore less desirable. In an alternative embodiment in which first metal 110 remains on n-type transistors, it is desirable if first metal 110 has a work function that is close to the conduction band of silicon (i.e. a work function of approximately 4.0 eV). In this alternative embodiment, suitable metals for first metal 110 include titanium (Ti), vanadium (V), zirconium (Zr), tantalum (Ta), aluminum (Al), niobium (Nb), tantalum nitride (TaN), and tantalum silicon nitride (TaSiN). First metal layer if used in an NMOS device is preferably TaSiN deposited by physical vapor deposition or plasma-enhanced CVD (PECVD).

Figure 2:
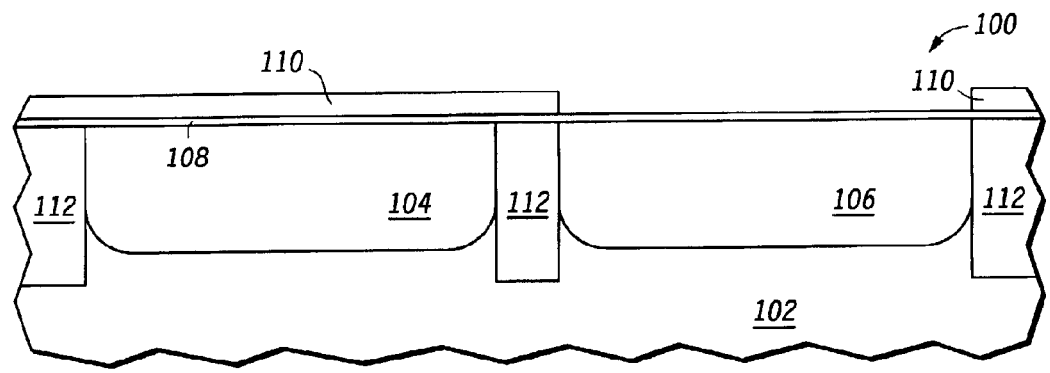
FIG. 2 is a processing step subsequent to FIG. 1 in which a first gate metal is selectively removed from portions of the semiconductor device.

Turning now to FIG. 2, a portion of first metal 110 has been selectively removed. In the depicted embodiment, the selective removal of first metal 110 is accomplished with a mask and etch process using the well mask used to form second well 106. In this embodiment, first metal 110 is removed over second well 106 (over which transistors of the second type will ultimately be fabricated). Thus, after transistor formation is completed, first metal 110 will remain in the structure of transistors of a first conductivity type while first metal 110 will not be present in transistors of the second conductivity type. The use of a critical dimension (CD) tolerant mask to define the portions of first metal 110 selectively removed as shown in FIG. 2 is not required because misalignment of the mask will not adversely affect subsequent processing.

In a preferred embodiment, a silicon oxide or silicon nitride hard mask (not shown) is used to pattern first metal 110 because many suitable metal etches used to remove first metal 110 from the region of the second conductivity type (i.e. from over second well 106) will also etch or degrade a photoresist mask. Therefore, a mask which can sufficiently withstand the metal etch is needed. The hard mask can be patterned using the same mask used to form the second well 106. First metal 110 is also removed without damage to underlying gate dielectric 108, which can be accomplished, for example, by using a piranha clean.

Figure 3:
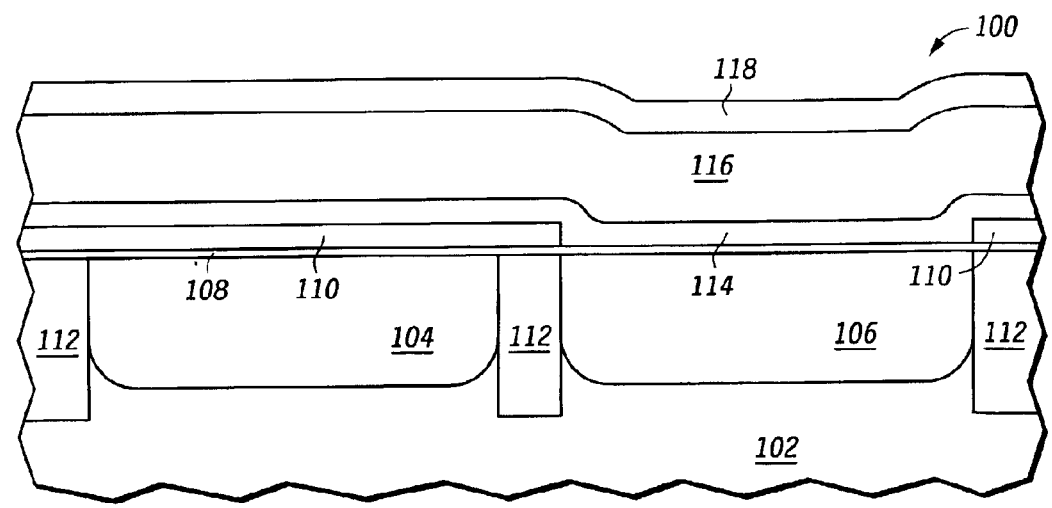
FIG. 3 is a partial cross sectional view subsequent to FIG. 2 in which a second gate metal, a polysilicon capping layer, and an ARC are deposited over the first gate metal.

Turning now to FIG. 3, a second metal 114 is formed over the first and second wells 104 and 106 of semiconductor substrate 102 thereby covering first metal 110 and exposed portions of gate dielectric 108. Second metal 114 is of a second metal type where the second metal type has a different work function than the first metal type used for first metal 110. In embodiments where the first metal type used for first metal 110 has a work function that is close to the valence band of the substrate material (e.g. silicon), the second metal type used for second metal 114 has a work function close to the conduction band of the substrate material. Conversely, in embodiments where the first metal type used for first metal 110 has a work function that is close to the conduction band of the substrate material, the second metal type used for second metal 114 has a work function that is close to the valence band of the substrate material. To reiterate, in accordance with the present invention the metal gate used for the p-type transistors is preferably CVD TiN, and the metal used for gates of the n-type transistors is preferably TaSiN deposited by physical vapor deposition (PVD).

As also depicted in FIG. 3, a silicon containing layer 116, which is either deposited as a conductive material or subsequently is made to be conductive, is deposited over second metal 114. In a preferred embodiment, silicon containing layer 116 is a polysilicon layer or a polysilicon-germanium layer which is either in-situ doped or subsequently doped to be sufficiently conductive for, e.g., a gate electrode application. Silicon containing layer may 116 also be a doped or undoped amorphous silicon or silicon-germanium layer.

Preferably second metal 114 is deposited to approximately the same thickness as first metal 110, with each metal layer being in the range of 50–1000 angstroms (5–100 nanometers) thick. Silicon containing layer 116 is preferably deposited to a thickness in the range of 100–1500 angstroms (10–150 nanometers). The silicon containing layer thickness is not critical, but the thicker it is the more margin there will be in a subsequent spacer formation process, as described below. The thickness of the silicon containing layer can be the variable thickness layer of the gate stack. In other words, if a particular gate structure should be limited or targeted to a particular total thickness, the silicon containing layer can be the layer whose thickness is varied to achieve that thickness.

Keeping with FIG. 3, an anti-reflective coating (ARC) 118 is deposited over silicon containing layer 116. ARC 118 is preferably a silicon-rich silicon nitride layer, although any ARC material which serves an ARC function for the particular lithography process used is suitable. In a preferred embodiment, the ARC is deposited by conventional techniques to about 200 angstroms (20 nanometers) thick.

Figure 4:
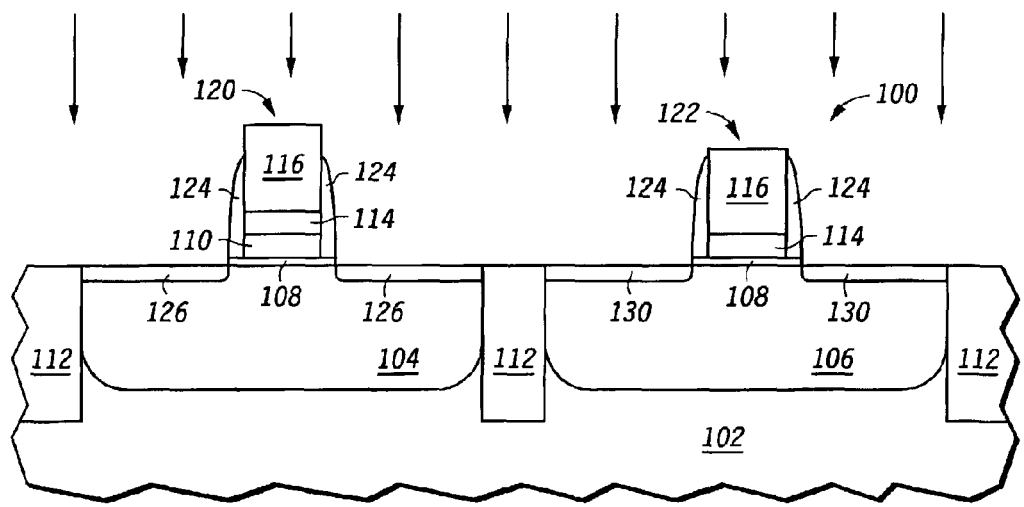
FIG. 4 is a processing step subsequent to FIG. 3 in which the deposited metals are patterned into gate structures and first spacers are formed adjacent the gate structures.

Turning now to FIG. 4, semiconductor device 100 is depicted after a gate mask and etch process have been performed to pattern first metal layer 110, second metal layer 114, and silicon containing layer 116, resulting in the formation of a first gate 120 over first well 104 and a second gate 122 over second well 106. First gate 120 includes a first metal 110 on gate dielectric 108 and a second metal 114 formed on first metal 110. In contrast, second gate 122 includes second metal 114 in contact with gate dielectric 108. Both the first gate 120 and second gate 122 have an overlying cap formed of silicon containing layer 116. ARC layer 118 is initially also patterned during the gate stack etch but it can be fully removed after the gate etch, and thus is not shown in FIG. 4. Because silicon containing layer 116 serves to protect the metal gates during subsequent etches and cleans, there is no need to keep an ARC layer on top of the gates. This is advantageous in that the ARC need not later be separately etched during a contact etch process to form a contact to the gate, and instead can be wet etched. Furthermore, complete removal of the ARC enables a more robust silicidation process on top of the gate.

In accordance with one embodiment of the invention wherein first metal 110 is TiN and the second metal 114 is TaSiN, the following etch was found suitable to form the gate stack without deleterious affects on the silicon containing layer 116 and gate dielectric 108. A silicon-rich silicon nitride as ARC 118 is first patterned using a plasma etch with a $CF_4$/Ar chemistry. A polysilicon layer for silicon containing layer 116 is then patterned using a plasma etch of a $Cl_2$/HBr chemistry. Thereafter, the TaSiN is patterned using a plasma etch with a $CF_4$/Ar chemistry similar to that used to etch through the ARC. This etch passivates the patterned polysilicon by formation of a polymer sidewall on exposed portions of the polysilicon. Because the gate dielectric 108 over second well 106 may not serve as a full etch stop, and to minimize the damage to gate dielectric 108 in this region, the bias power (i.e. the bias on the wafer) is preferably reduced near the end of the etch of the TaSiN layer. When to reduce the power can be readily determined experimentally. After clearing the TaSiN, the TiN is patterned using a plasma etch chemistry using $Cl_2$ and He. An important aspect of etching metal 110 is to minimize exposure of gate dielectric 108 to the etch chemistry in the region of second gate 122 and second well 106 so that the gate dielectric is not removed in this area. Removal of the gate dielectric may result in etching or trenching of the underlying silicon in second well 106. To avoid damage to the gate dielectric, the ratio of the source bias to the substrate bias used during the etch of TiN can be significantly increased relative to conventional TiN etching, together with a reduced chamber pressure. As such, the TiN is etched very fast and therefore exposure of the gate dielectric in the other portion of the device to the etch is minimized. As an example, a suitable ratio of source bias to substrate bias may be about 33:1, as compared to 2:1 which is more typically used in conventional TiN etching. The chamber pressure, for example, could be reduced from 40 millitorr (mT), which is conventionally used, to 10 mT.

Continuing with FIG. 4 after patterning first gate 120 and second gate 122, first spacers 124 are formed along sides of both gates. In a preferred embodiment, first spacers 124 are formed by depositing a thin layer of silicon nitride (100–300 angstroms or 10–30 nanometers) and then anisotropically etching the wafer so that the silicon nitride is left only along the sidewalls of the gates. As a result of the etch, the resulting spacers will have tapered shaped, as shown in FIG. 4, having a maximum thickness or width near the bottom each gate of about 50–200 angstroms (5–20 nanometers). First spacers 124 serve to protect the metal gates from being etched during subsequent removal of an implant mask. As mentioned previously, conventional piranha and SC-1 cleans used to strip photoresist masks also attack many metals being proposed for metal gates.

As illustrated in FIG. 4, the height of first spacers 124 relative to the total height or thickness of the gates may vary. For example, first spacers 124 rise higher along the sidewall of second gate 122 as compared to first gate 120. This is not a problem because the presence of silicon containing layer 116 provides sufficient protection for the metal, gates during subsequent etches because silicon containing layer 116 is resistant to attack from these etches. Thus, the process has a large process margin for variations in topography and gate stack heights due the presence of silicon containing layer 116. As long as the spacers cover all of the sidewalls of the underlying metals beneath silicon containing layer 116, the gate stack will be adequately protected.

After formation of first spacers 124, unprotected portions of gate dielectric 108 (e.g. portions other than beneath first gate 120, second gate 122, and first spacers 124) are removed if the dielectric is a high K dielectric (e.g. K greater than 3.9). For lower K values, e.g. in the case of silicon dioxide, the gate dielectric may remain. Removal of the gate dielectric can be accomplished using either dry or wet chemistries, or by annealing to convert the material to a volatile species, depending on the particular dielectric material used.

Next, extension regions 126 and 130 are formed self-aligned to first gate 120 and second gate 122, respectively, as also shown in FIG. 4. Extension regions are formed in MOS transistor structures as extensions to the source and drain regions to prevent short channel effects. Because the extension regions 126 and 130 will be of two different conductivity types (with extension regions 126 being of the first conductivity type and extension regions 130 being of the second conductivity type), a mask is needed to mask off a portion of the device during each implant step. For example, the portion of the device associated with second well 106 is masked off during formation of extension regions 126 and the portion of the device associated with first well 104 is masked off during formation of extension regions 130. The masks used during the implantation steps may be conventional photoresist masks. As mentioned previously, removal of photoresist masks at this stage in conventional dual metal gate processes can be harmful because the cleaning solutions may attack the gate metal. However, in accordance with the invention, the combination of first spacers 124 and silicon containing layer 116 enable the implant masks to be easily removed with conventional cleaning chemistries, such as piranha and SC-1 without harmful affects on the metal gates themselves.

Although not illustrated, halo implants may also be performed at this point in accordance with conventional practices. Again, implant masks need to be used and removal of these masks can be readily achieved without harm to metal gate materials by practicing the present invention.

Figure 5:
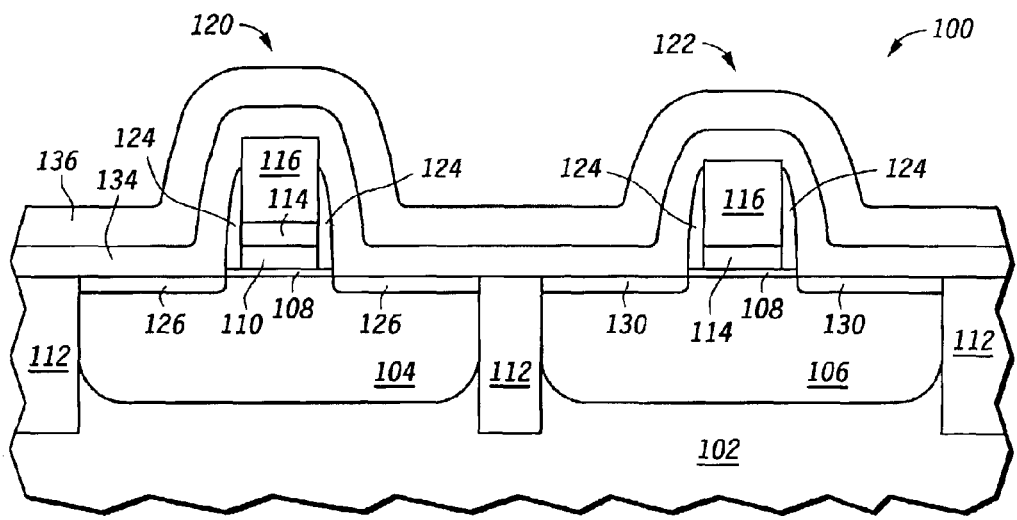
FIG. 5 is a processing step subsequent to FIG. 4 in which an oxide layer and a nitride layer are deposited over substrate, including over the gate structures and first spacers.

Moving on to FIG. 5, after extension regions 126 and 130 are formed, an oxide liner 134 is deposited over the device, including over first gate 120 and second gate 122 and first spacers 124. A layer 136 is formed over oxide liner 134. Oxide liner 134 is generally about 50–250 angstroms (5–25 nanometers) thick, while layer 136 is generally 300–1000 angstroms (30–100 nanometers) thick. Oxide liner 134 is preferably formed of silicon dioxide and layer 136 is preferably silicon nitride, but may be of another material that can be etched sufficiently selective to oxide liner 134 and that does not react with a silicide forming metal (if the gates or source/drain regions of the transistors will be silicided).

Figure 6:
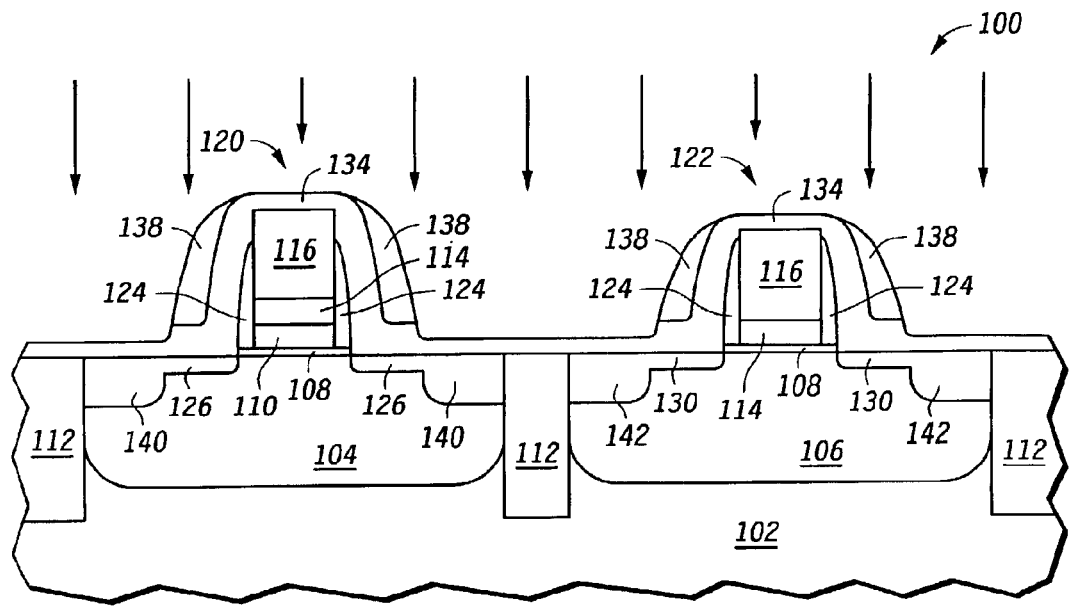
FIG. 6 is a processing step subsequent to FIG. 5 in which second spacers are formed from the nitride layer while simultaneously thinning the oxide layer, and subsequently the source/drain regions are formed.

As illustrated in FIG. 6, layer 136 is anisotropicly etched to form second spacers 138 without completely removing oxide liner 134. This can be accomplished with a combination of silicon dioxide and silicon nitride and using a conventional dry etch chemistry of $CF_4$, HBr and Ar. The oxide liner 134 may be thinned during formation of spacers 138, but this is not detrimental as long as the underlying substrate material (e.g. silicon) is not exposed at this point in the process.

As also shown in FIG. 6, source/drain regions are formed in a self-aligned manner in device 100 by implantation after formation of spacers 138 through the thinned oxide liner 134. Source/drain regions 140 are formed as part of the transistor which includes first gate 120 while source/drain regions 142 are formed as part of the transistor which includes second gate 122. The source/drain regions are formed using conventional implantation techniques.

Figure 7:
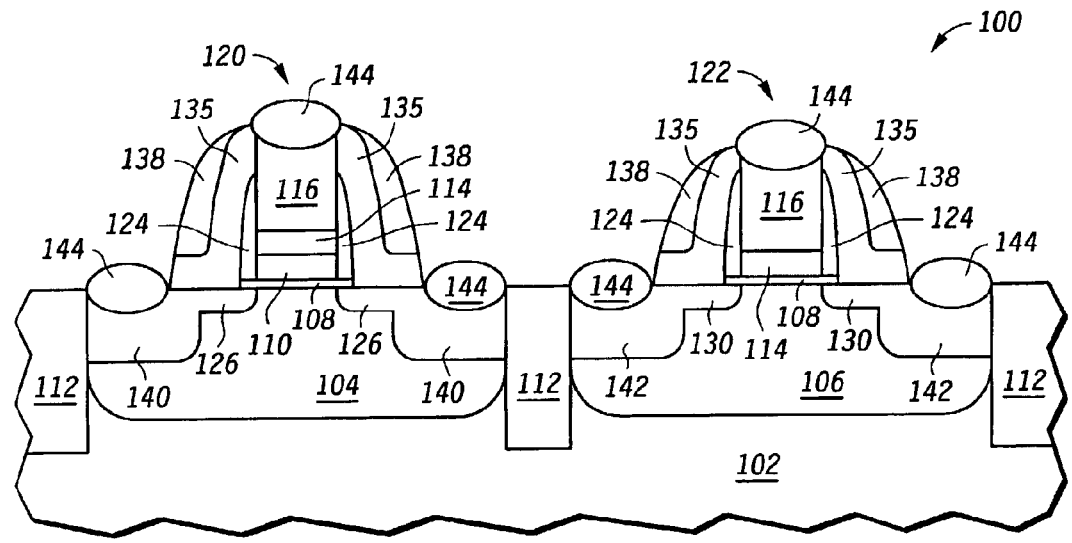
FIG. 7 is a processing step subsequent to FIG. 6 in which the thin oxide layer is removed over the gates and source/drain regions, and these regions are subsequently salicided to form a substantially completed device.

Now in reference to FIG. 7, an anneal is next performed to diffuse the extension and source/drain regions to the desired profile and to activate the dopants. Again, this is done using conventional practices. Thereafter, remaining portions of the oxide liner 134 are removed from unprotected regions of the device (e.g. from above the source/drain regions, the gates, and the isolation regions) using a conventional wet etch. The exposed source/drain regions and gates are then silicided using a self-aligned process by, for example, depositing a blanket layer of titanium, cobalt or nickel and thermally reacting this metal with the adjacent silicon regions to form silicide regions 144 as shown in FIG. 7. Thus, there is little deleterious affect in using a silicon containing cap over first gate 120 and second gate 122 from a resistance perspective because the silicidation process used to silicide the source/drain regions can be used to silicide the gate at the same time for satisfactory resistance levels. Resistance can be further reduced by completely siliciding the silicon containing layer 116 in the gate stack provided the silicided regions above the source/drain regions and the source/drain regions themselves are adjusted as may be needed.

At this point the capped dual metal gate device is substantially complete. As one of ordinary skill in the art will recognize and appreciate, various interlayer dielectrics and metal inconnects are subsequently formed to route the various transistors in accordance with the device design. Bond pads and passivation layers are then added and the individual integrated circuits are tested, singulated, and packaged for final distribution.

By now it should be apparent that there has been providing a capped dual metal gate structure for use in a CMOS process which overcomes the problems previously described. More specifically, the present invention provides a reliable method for forming a dual gate metal structure using a silicon containing cap layer and zero spacers (first spacers 124) which renders the gate stack resistant to conventional piranha and SC-1 cleans used to remove photoresist masks following halo and extension implants. The cap and spacers expand the process window so that the process is reliable even with topographical variations across the wafer surface. The silicon containing cap also eliminates the need to keep an ARC layer on the gate through contact etch, and therefore eliminates the need to separately etch the ARC during the contact etch process. The silicon containing cap thickness is also scalable, allowing it to be varied to match the particular targeted gate stack height. A further advantage of the invention is that it can be implemented independent of the choice of metals and gate dielectrics used to form the gate stacks. Moreover, use of the silicon containing cap allows the use of more conventional self-aligned silicide processes, wherein the gate and the source/drain regions are silicided at the same time.

In the foregoing specification, the invention has been described with reference to specific embodiments. However, one of ordinary skill in the art appreciates that various modifications and changes can be made without departing from the scope of the present invention as set forth in the claims below. For example, although the invention has been described with respect to specific conductivity types or polarity of potentials, skilled artisans appreciated that conductivity types and polarities of potentials may be reversed. Additionally, the invention can be extended to form three or more gate stacks with different metal gate materials. For example, in addition to having a gate stack which includes one metal capped with a silicon containing layer and a gate stack which includes two metals capped with a silicon containing layer, there could be a third gate stack which includes three metals capped with a silicon containing layer. The third gate stack may be advantageous for forming the input/output transistors of a device that typically have higher threshold voltage requirements than logic transistors. A third gate stack could be achieved by depositing and patterning the first metal layer, as shown in FIG. 2, then depositing a second metal and patterning it similarly over the area for the second gate stack. Then depositing the third metal layer and the silicon containing capping layer as shown in FIG. 3. This can further be extended similarly to form a fourth gate stack, a fifth gate stack, etc. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device comprising:
    a semiconductor substrate having a first well and a second well, wherein the first well has a first conductivity type and the second well has a second conductivity type different than the first conductivity type;
    a gate dielectric over at least a portion of a first well and a portion of a second well;
    a first gate over the first well and the gate dielectric and comprising a titanium nitride layer, a first tantalum silicon nitride layer, and a first conductive silicon-containing layer, wherein the titanium nitride layer is in physical contact with the gate dielectric; and
    a second gaze over the second well and the gate dielectric and comprising a tantalum silicon nitride layer and a conductive silicon-containing layer, wherein the tantalum silicon nitride layer of the second gate is in physical contact with the gate dielectric.

2. The semiconductor device of claim 1, further comprising first spacers adjacent sidewalls of the first gate and the second gate and second spacers adjacent the first spacers.

3. The semiconductor device of claim 2, wherein the first spacers expose a portion of the sidewalls of the conductive silicon-containing layer of the first gate.

4. The semiconductor device of claim 2, further comprising an oxide liner between the first spacers and the second spacers.

5. The semiconductor device of claim 2, wherein the first spacers are thinner than the second spacers.

6. The semiconductor device of claim 5, wherein the first spacers have a maximum thickness of approximately 50 to 200 angstroms.

7. The semiconductor device of claim 1, wherein the conductive silicon-containing layer is a material selected from the group consisting of silicon and silicon germanium.

8. The semiconductor device of claim 1, further comprising a silicide over the conductive silicon-containing layer in both the first gate and the second gate.

9. The semiconductor device of claim 1, wherein the first well is n-type and the second well is p-type.

* * * * *